(12) United States Patent
Pandey

(10) Patent No.: US 12,278,278 B2
(45) Date of Patent: Apr. 15, 2025

(54) BIPOLAR JUNCTION TRANSISTORS WITH A BASE LAYER PARTICIPATING IN A DIODE

(71) Applicant: GlobalFoundries U.S. Inc., Malta, NY (US)

(72) Inventor: Shesh Mani Pandey, Saratoga Springs, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 261 days.

(21) Appl. No.: 17/872,047

(22) Filed: Jul. 25, 2022

(65) Prior Publication Data
US 2023/0137751 A1 May 4, 2023

Related U.S. Application Data

(60) Provisional application No. 63/273,318, filed on Oct. 29, 2021.

(51) Int. Cl.
*H01L 29/735* (2006.01)
*H01L 29/66* (2006.01)

(52) U.S. Cl.
CPC ........ *H01L 29/735* (2013.01); *H01L 29/6625* (2013.01)

(58) Field of Classification Search
CPC ... H01L 21/04; H01L 21/331; H01L 21/8222; H01L 21/8229; H01L 21/824; H01L 31/11; H01L 31/1105; H01L 2924/1305; H01L 2924/13056; H01L 29/04; H01L 29/0804–0834; H01L 29/1004;
(Continued)

(56) References Cited

U.S. PATENT DOCUMENTS 7,763,518 B2 7/2010 Ho et al.
10,121,927 B2 * 11/2018 Nakayama ........ H01L 31/02327
(Continued)

FOREIGN PATENT DOCUMENTS

EP 0401786 B1 2/1995

OTHER PUBLICATIONS

T. Thibeault et al., "A study of ultra-high performance SiGe HBT devices on SOI," 2013 IEEE Bipolar/BiCMOS Circuits and Technology Meeting (BCTM), 2013, pp. 235-238, doi: 10.1109/BCTM.2013.6798184.
(Continued)

*Primary Examiner* — Natalia A Gondarenko
(74) *Attorney, Agent, or Firm* — Thompson Hine LLP; Francois Pagette

(57) ABSTRACT

Structures for a bipolar junction transistor and methods of forming a structure for a bipolar junction transistor. The structure comprises a first terminal including a first raised semiconductor layer, a second terminal including a second raised semiconductor layer, and a base layer positioned in a lateral direction between the first raised semiconductor layer of the first terminal and the second raised semiconductor layer of the second terminal. The structure further comprises a modulator including a semiconductor layer in direct contact with the base layer. The base layer has a first conductivity type, and the semiconductor layer has a second conductivity type opposite to the first conductivity type.

20 Claims, 6 Drawing Sheets

(58) Field of Classification Search
CPC ............. H01L 29/1008; H01L 29/0649; H01L 29/0696; H01L 29/41708; H01L 29/42304; H01L 29/66234–66348; H01L 29/66265; H01L 29/66295–66303; H01L 29/66325; H01L 29/66333–66348; H01L 29/66287; H01L 29/66242; H01L 29/73–7378; H01L 29/732; H01L 29/735; H01L 29/737; H01L 29/739–7398; H01L 27/0229–0244; H01L 27/0262; H01L 27/0263; H01L 27/082–0828; H01L 27/102; H01L 27/1022; H01L 27/11801; H01L 27/11896; H01L 27/2445; H01L 29/7325; H01L 29/0817; H01L 29/7375; H01L 29/7393–7395; H01L 29/7397; H01L 29/6625; H01L 29/10; H01L 29/861; H01L 29/7317; G06F 17/50; G06F 17/5045; G06F 17/5068; G02F 1/025; G02F 1/0153; G02F 1/2257
USPC ....... 257/592, 139, 423, 183, 197, 526, 575, 257/350, 27.112, 21.461; 438/479, 430
See application file for complete search history.

(56) References Cited

U.S. PATENT DOCUMENTS

| | | | |
|---|---|---|---|
| 2014/0239451 A1* | 8/2014 | Ito | H01L 29/735 257/565 |
| 2015/0236093 A1* | 8/2015 | Chan | H01L 29/0821 257/565 |
| 2015/0270335 A1 | 9/2015 | Sadovnikov et al. | |
| 2021/0091180 A1 | 3/2021 | Pekarik et al. | |
| 2021/0271119 A1* | 9/2021 | Yu | G02F 1/025 |
| 2021/0389612 A1* | 12/2021 | Ram | G02F 1/025 |

OTHER PUBLICATIONS

German Patent and Trademark Office, First Office Action issued in German Patent Application No. 102023100306.2 on Sep. 7, 2023; 7 pages.

* cited by examiner

BIPOLAR JUNCTION TRANSISTORS WITH A BASE LAYER PARTICIPATING IN A DIODE

CROSS-REFERENCE TO RELATED APPLICATIONS

This application claims the benefit of U.S. Provisional Patent Application No. 63/273,318, filed Oct. 29, 2021, which is hereby incorporated by reference herein in its entirety.

BACKGROUND

The invention relates generally to semiconductor devices and integrated circuit fabrication and, in particular, to structures for a bipolar junction transistor and methods of forming a structure for a bipolar junction transistor.

A bipolar junction transistor is a multi-terminal electronic device that includes an emitter, a collector, and an intrinsic base arranged between the emitter and collector. In an NPN bipolar junction transistor, the emitter and collector are comprised of n-type semiconductor material, and the intrinsic base is comprised of p-type semiconductor material. In a PNP bipolar junction transistor, the emitter and collector are comprised of p-type semiconductor material, and the intrinsic base is comprised of n-type semiconductor material. During operation, the base-emitter junction is forward biased, the base-collector junction is reverse biased, and the collector-emitter current may be controlled with the base-emitter voltage.

A heterojunction bipolar transistor is a variant of a bipolar junction transistor in which the semiconductor materials of the terminals have different energy bandgaps, which creates heterojunctions. For example, the collector and/or emitter of a heterojunction bipolar transistor may be constituted by silicon, and the intrinsic base of a heterojunction bipolar transistor may be constituted by a silicon-germanium alloy, which is characterized by a narrower band gap than silicon.

Although existing structures have proven suitable for their intended purpose, improved structures for a bipolar junction transistor and methods of forming a structure for a bipolar junction transistor are needed.

SUMMARY

In an embodiment of the invention, a structure for a lateral bipolar junction transistor is provided. The structure comprises a first terminal including a first raised semiconductor layer, a second terminal including a second raised semiconductor layer, and a base layer positioned in a lateral direction between the first raised semiconductor layer of the first terminal and the second raised semiconductor layer of the second terminal. The structure further comprises a modulator including a semiconductor layer in direct contact with the base layer. The base layer has a first conductivity type, and the semiconductor layer has a second conductivity type opposite to the first conductivity type.

In an embodiment of the invention, a method of forming a structure for a lateral bipolar junction transistor is provided. The method comprises forming a first terminal including a first raised semiconductor layer and a second terminal including a second raised semiconductor layer, forming a base layer positioned in a lateral direction between the first raised semiconductor layer of the first terminal and the second raised semiconductor layer of the second terminal, and forming a modulator including a semiconductor layer in direct contact with the base layer. The base layer has a first conductivity type, and the semiconductor layer has a second conductivity type opposite to the first conductivity type.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
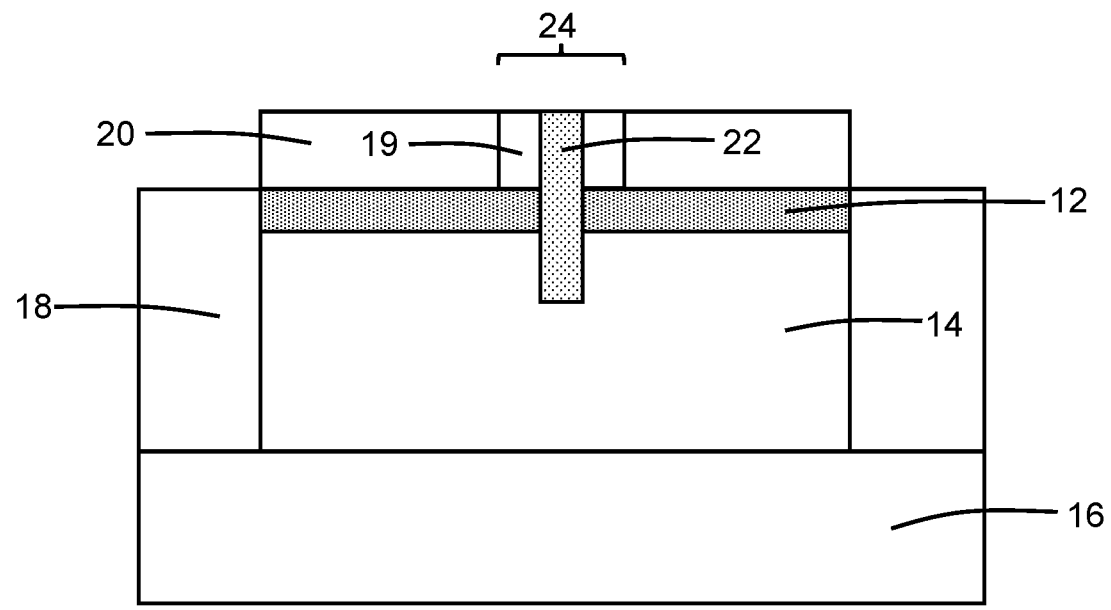
FIGS. 1-6 are cross-sectional views of a structure at successive fabrication stages of a processing method in accordance with embodiments of the invention.

With reference to FIG. 1 and in accordance with embodiments of the invention, a semiconductor-on-insulator (SOI) substrate includes a device layer 12 defining a semiconductor layer, a buried insulator layer 14, and a substrate 16. The device layer 12 is separated from the substrate 16 by the intervening buried insulator layer 14 and is considerably thinner than the substrate 16. The device layer 12 and the substrate 16 may be comprised of a semiconductor material, such as single-crystal silicon, and may be lightly doped to have, for example, p-type conductivity. The buried insulator layer 14 may be comprised of a dielectric material, such as silicon dioxide, that is an electrical insulator. The buried insulator layer 14 has a lower interface with the substrate 16 and an upper interface with the device layer 12. The device layer 12 is electrically isolated from the substrate 16 by the buried insulator layer 14. In an embodiment, the device layer 12 may have a thickness in a range of about 4 nanometers (nm) to about 10 nm, and the device layer 12 may be used to fabricate fully-depleted silicon-on-insulator (FDSOI) device structures.

A shallow trench isolation region 18 is formed in the device layer 12. In an embodiment, the shallow trench isolation region 18 may penetrate fully through the device layer 12 to the buried insulator layer 14. The shallow trench isolation region 18 surrounds an active region that is comprised of a section of the semiconductor material of the device layer 12. The shallow trench isolation region 18 may be formed by a shallow trench isolation technique that patterns trenches in the device layer 12 with lithography and etching processes, deposits a dielectric material to overfill the trenches, and planarizes the dielectric material using chemical mechanical polishing and/or an etch back to remove excess dielectric material from the field. The dielectric material may be comprised of a dielectric material, such as silicon dioxide, that is an electrical insulator.

A dielectric layer 20 is formed on the device layer 12. In an embodiment, the dielectric layer 20 may contain silicon dioxide that is formed by a thermal oxidation process, which may also thicken the shallow trench isolation region 18. An opening 24 is patterned that extends through the device layer 12 and dielectric layer 20 and penetrates as a trench into the buried insulator layer 14. The opening 24 penetrates partially through the buried insulator layer 14. The opening 24 may be formed using one or more lithography and etching processes in which each etching process may be a reactive ion etching process. An upper portion of the opening 24 in the dielectric layer 20 may be wider than a lower portion of the opening 24 in the device layer 12 and buried insulator layer 14.

An inner spacer 19 may narrow the width of the upper portion of the opening 24 in the dielectric layer 20. The inner spacer 19 may be comprised of a dielectric material, such as silicon nitride, that is conformally deposited and anisotropically etched. In an embodiment, the inner spacer 19 may be formed after forming the upper portion of the opening 24 and before forming the lower portion of the opening 24.

A semiconductor layer 22 is formed inside the opening 24. The semiconductor layer 22 may be comprised of a semiconductor material, such as polysilicon. The semiconductor layer 22 may be doped (e.g., heavily doped) with a concentration of a dopant, such as an n-type dopant (e.g., arsenic or phosphorus) to provide n-type conductivity.

Figure 2:
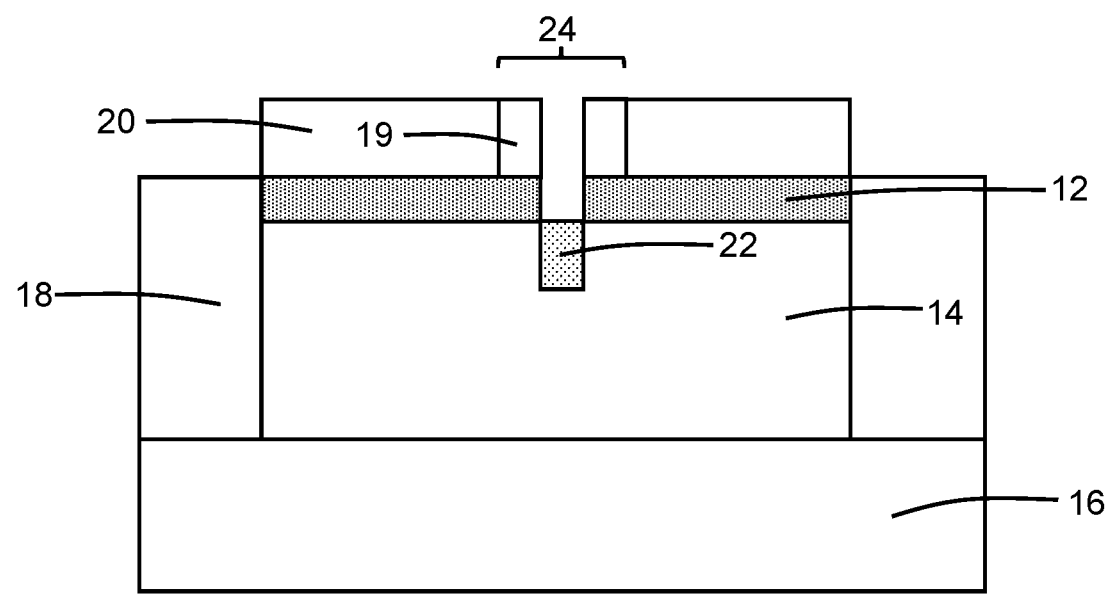

With reference to FIG. 2 in which like reference numerals refer to like features in FIG. 1 and at a subsequent fabrication stage, the semiconductor layer 22 is recessed by, for example, an etching process. In an embodiment, the recessed remainder portion of the semiconductor layer 22 may be arranged in the lower portion of the opening 24 within the buried insulator layer 14. In an embodiment, the semiconductor layer 22 may be recessed inside the opening 24 to a level that is at or below the interface between the device layer 12 and the buried insulator layer 14.

Figure 3:
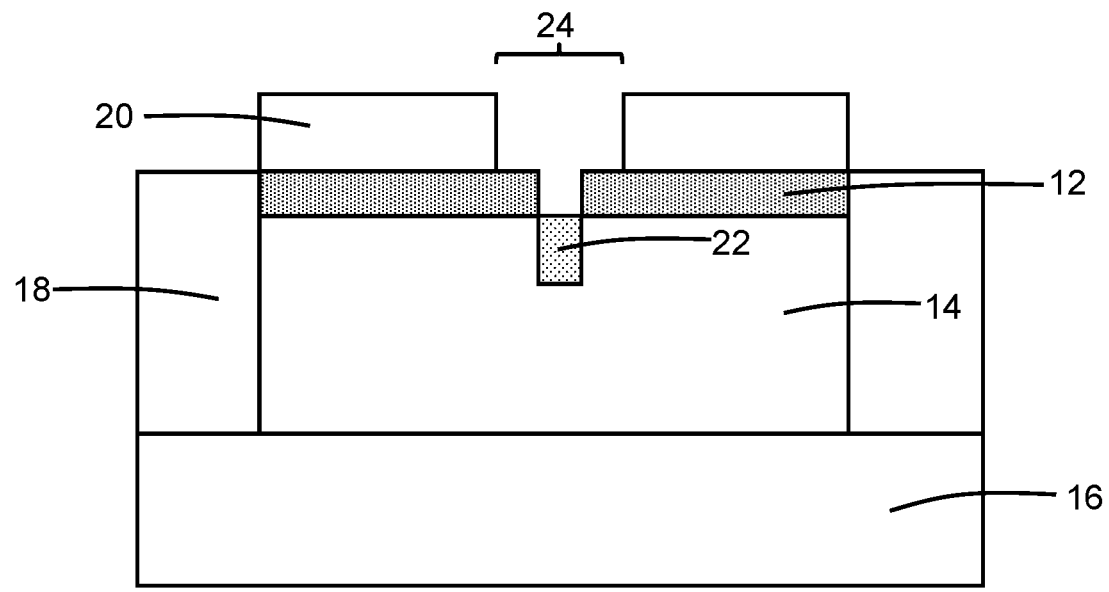

With reference to FIG. 3 in which like reference numerals refer to like features in FIG. 2 and at a subsequent fabrication stage, the inner spacer 19 may be removed by an etching process that is selective to the materials of the dielectric layer 20 and the semiconductor layer 22. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal process. The removal of the inner spacer 19 effectively widens the upper portion of the opening 24.

Figure 4:
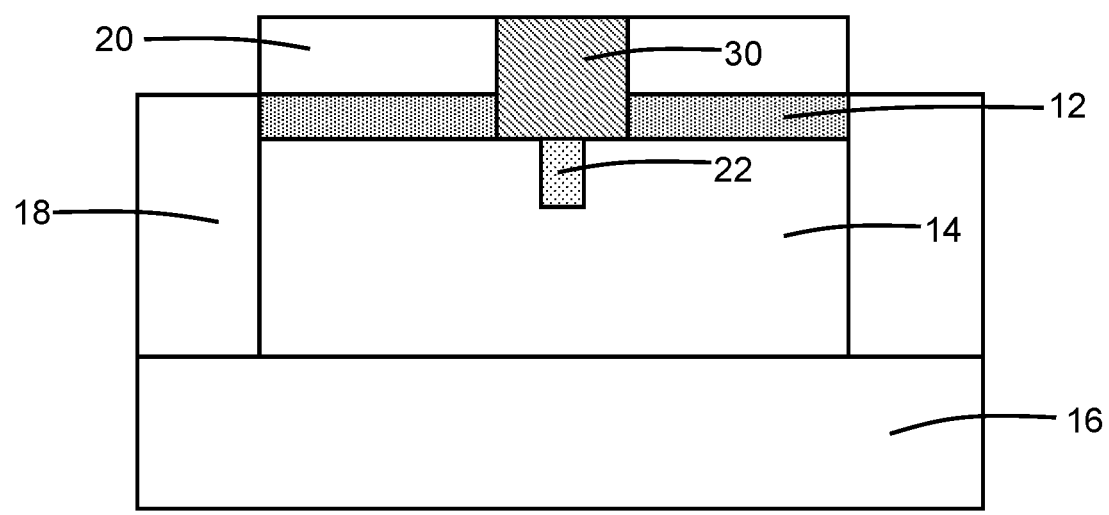

With reference to FIG. 4 in which like reference numerals refer to like features in FIG. 3 and at a subsequent fabrication stage, a base layer 30 is formed inside the opening 24 and above the recessed portion of the semiconductor layer 22. The removed inner spacer 19 permits the width dimension of the base layer 30 to be greater than the width dimension of the semiconductor layer 22, which facilitates contacting the base layer 30 while minimizing the width dimension of the semiconductor layer 22. The semiconductor layer 22 is positioned in a vertical direction between the base layer 30 and the substrate 16.

The base layer 30 may contain single-crystal semiconductor material that is epitaxially grown. In that regard, the base layer 30 may be formed by the epitaxial growth of semiconductor material from the surfaces of the device layer 12 bordering the opening 24. In an embodiment, the semiconductor material of the base layer 30 may be comprised at least in part, or entirely, of a silicon-germanium alloy. In an embodiment, the semiconductor material of the base layer 30 may be comprised at least in part, or entirely, of a silicon-germanium alloy including silicon and germanium combined in an alloy with the silicon content ranging from 95 atomic percent to 50 atomic percent and the germanium content ranging from 5 atomic percent to 50 atomic percent. In an alternative embodiment, the base layer 30 may have a germanium content that is graded, for example, in a vertical direction, which may be accomplished during epitaxial growth by varying the reactants. In an alternative embodiment, the semiconductor material of the base layer 30 may be comprised entirely of silicon and may lack a germanium content.

The base layer 30 may be doped to have an opposite conductivity type from the semiconductor layer 22. In an embodiment, the base layer 30 may be in situ doped during epitaxial growth with a concentration of a dopant, such as a p-type dopant (e.g., boron) that provides p-type conductivity. In an embodiment, the semiconductor material of the base layer 30 may be uniformly doped with a p-type dopant. In an embodiment, the base layer 30 may directly contact the semiconductor layer 22 to define a p-n junction characteristic of a diode and across which the dopant conductivity type changes. Dopant may diffuse from the base layer 30, during epitaxial growth, into underlying sections of the device layer 12 between the base layer 30 and the buried insulator layer 14. Consequently, the underlying sections of the device layer 12 receiving the diffused dopant may merge into the base layer 30 such that the base layer 30 extends to the buried insulator layer 14.

Figure 5:
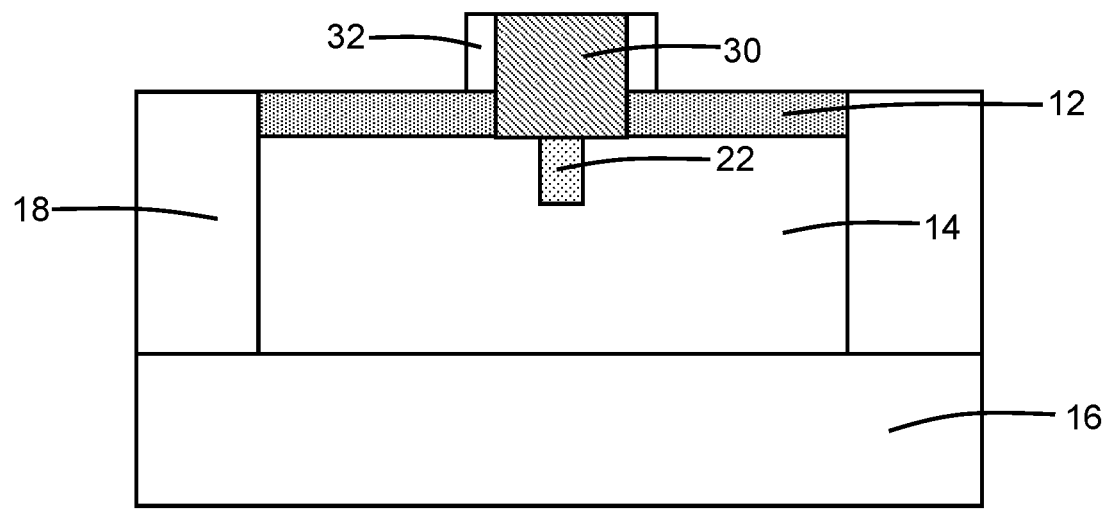

With reference to FIG. 5 in which like reference numerals refer to like features in FIG. 4 and at a subsequent fabrication stage, the dielectric layer 20 is patterned to open the device layer 12 adjacent to the opposite side surfaces of the base layer 30. The remaining portions of the dielectric layer 20 may define dielectric spacers 32. Alternatively, the dielectric layer 20 may be fully removed and the dielectric spacers 32 may be formed by a separate deposition and anisotropic etching process.

Figure 6:
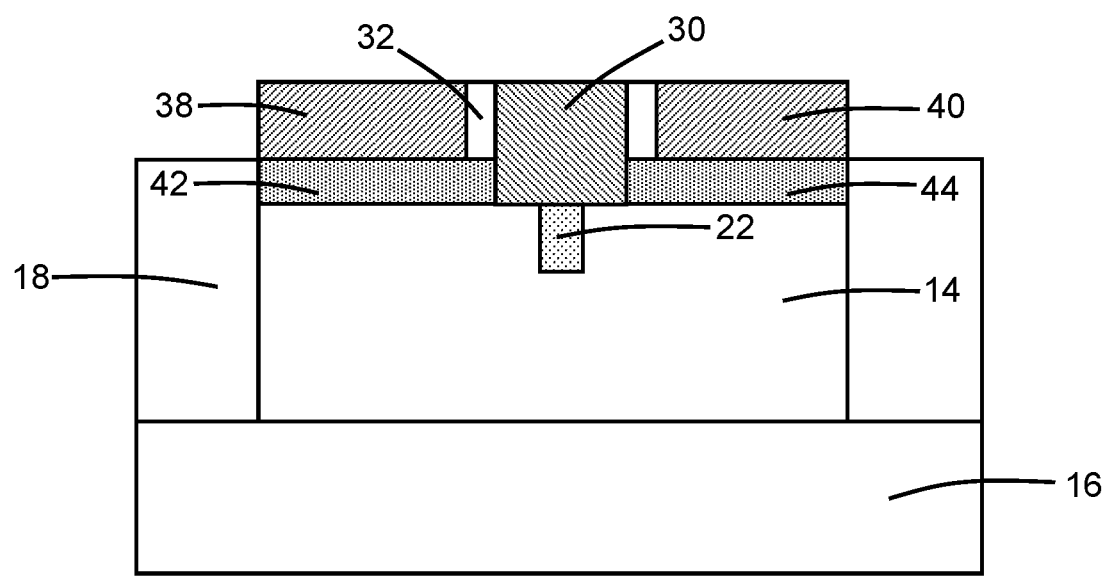

With reference to FIG. 6 in which like reference numerals refer to like features in FIG. 5 and at a subsequent fabrication stage, raised semiconductor layers 38, 40 are formed on the respective sections of the device layer 12 adjacent to the side surfaces of the base layer 30. The base layer 30 is positioned in a lateral direction between the raised semiconductor layer 38 and the raised semiconductor layer 40. The dielectric spacers 32 separate and electrically isolate the raised semiconductor layers 38, 40 from the opposite side surfaces of the base layer 30. The semiconductor layer 22 is laterally spaced from the raised semiconductor layers 38, 40.

The raised semiconductor layers 38, 40 may be formed by the epitaxial growth of semiconductor material (e.g., single-crystal silicon) from the exposed areas on the top surface of the device layer 12 adjacent to the dielectric spacers 32. In an embodiment, the semiconductor material of the raised semiconductor layers 38, 40 may be doped to have an opposite conductivity type from the base layer 30. In an embodiment, the semiconductor material of the raised semiconductor layers 38, 40 may be doped (e.g., heavily doped) with a concentration of a dopant, such as an n-type dopant (e.g., phosphorus or arsenic) that provides n-type conductivity.

Doped regions 42, 44 may be formed in respective sections of the device layer 12 adjacent to the base layer 30 by dopant diffusion from the raised semiconductor layers 38, 40 into these sections of the device layer 12 during epitaxial growth. The raised semiconductor layers 38 and doped region 42, the raised semiconductor layer 40 and doped region 44, and the base layer 30 may define the terminals of a lateral bipolar junction transistor (e.g., a lateral heterojunction bipolar transistor). In an embodiment, the raised semiconductor layer 38 and the doped region 42 may provide a collector of a lateral bipolar junction transistor, the raised semiconductor layer 40 and the doped region 44 may provide an emitter of the lateral bipolar junction transistor, and the base layer 30 provides an intrinsic base that is positioned in a lateral direction between the emitter and the collector. In an alternative embodiment, the raised semiconductor layer 38 and the doped region 42 may provide an emitter of a lateral bipolar junction transistor, the raised semiconductor layer 40 and the doped region 44 may provide a collector of the lateral bipolar junction transistor, and the base layer 30 provides an intrinsic base that is positioned in a lateral direction between the emitter and collector.

Figure 7:
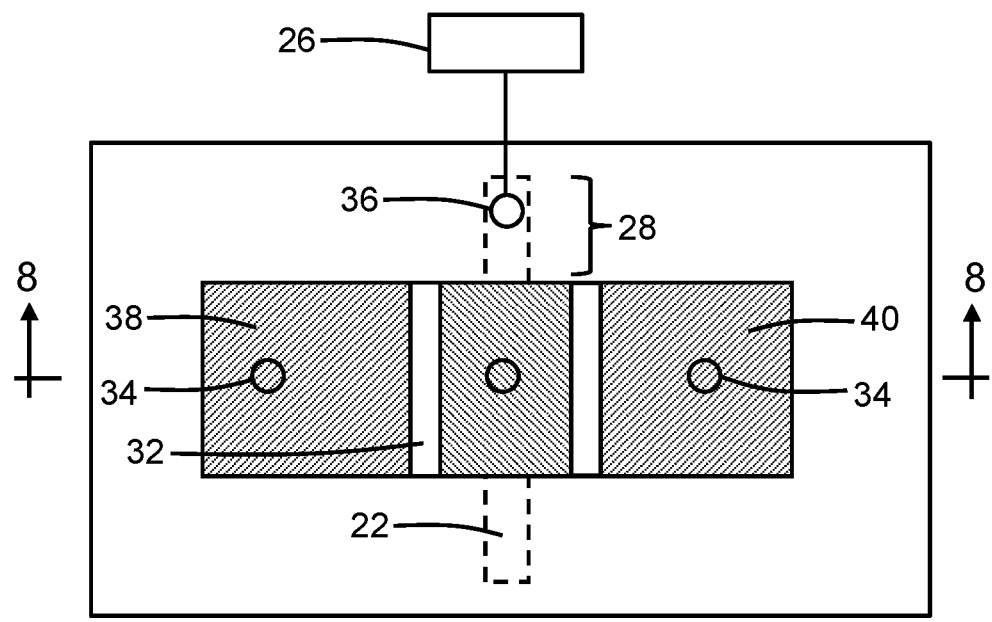
FIG. 7 is a top view of the structure at a fabrication stage subsequent to FIG. 6.
Figure 8:
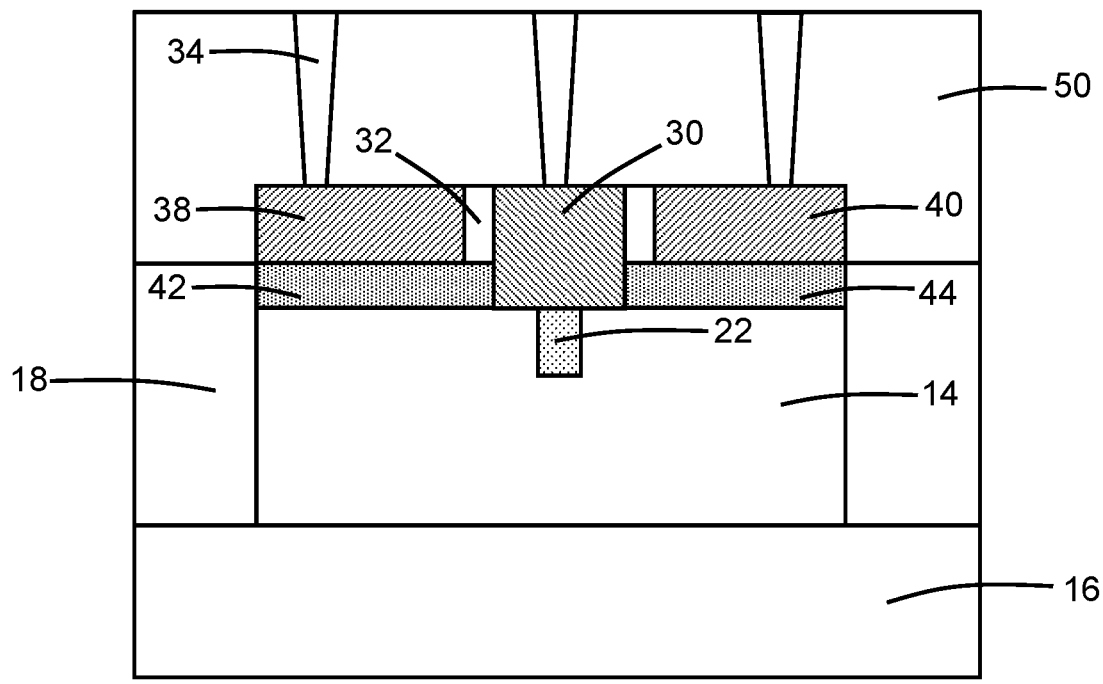
FIG. 8 is a cross-sectional view taken generally along line 8-8 in FIG. 7.

With reference to FIGS. 7, 8 in which like reference numerals refer to like features in FIG. 6 and at a subsequent fabrication stage, middle-of-line processing follows, which includes the formation of an interconnect structure that includes contacts 34 that are coupled to the base layer 30 providing the intrinsic base of the lateral bipolar junction transistor and the raised semiconductor layers 38, 40 providing the collector and emitter of the lateral bipolar junction transistor, and a contact 36 that is coupled to the semiconductor layer 22. The semiconductor layer 22 may include a lateral extension in the layout that facilitates coupling to the contact 36. The contacts 34, 36 may comprise a metal, such as tungsten, and may be formed in openings patterned in a deposited dielectric layer 50 comprised of a dielectric material, such as silicon dioxide, that is an electrical insulator.

The resultant device structure is a lateral bipolar junction transistor or lateral heterojunction bipolar transistor with laterally-arranged emitter/base/collector and may formed using an SOI substrate. The raised semiconductor layers 38, 40 provide raised portions of the emitter and collector, the base layer 30 provides the intrinsic base, and the semiconductor layer 22 and the base layer 30 participate in defining a diode that may be biased during device operation. The base carriers may be modulated and controlled by applying a bias from a power supply 26 to a modulator defined by the semiconductor layer 22.

Figure 9:
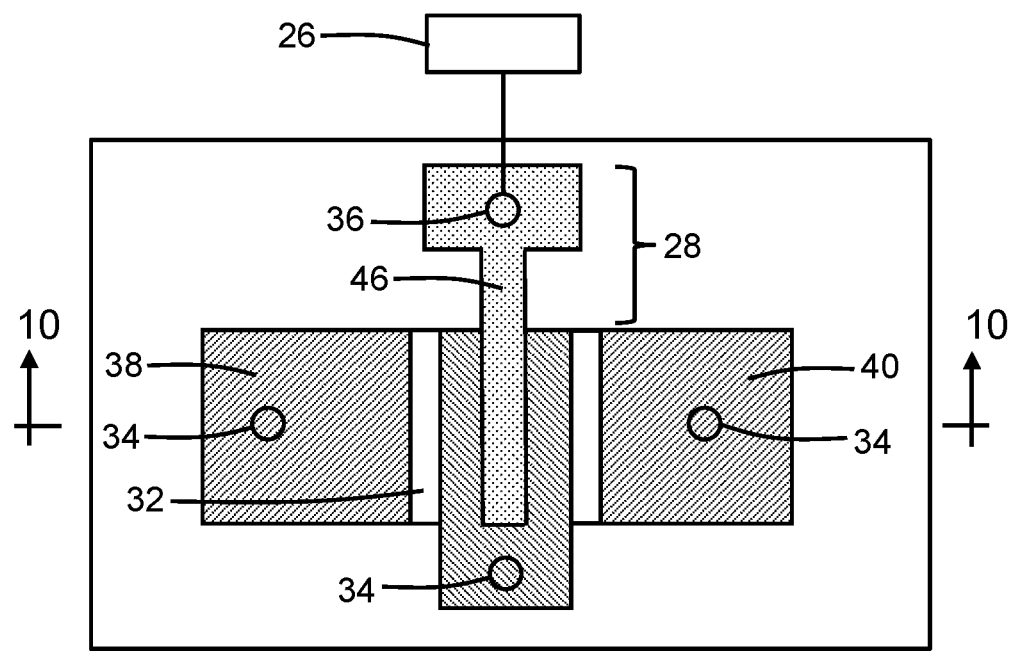
FIG. 9 is a top view of a structure in accordance with alternative embodiments of the invention.
Figure 10:
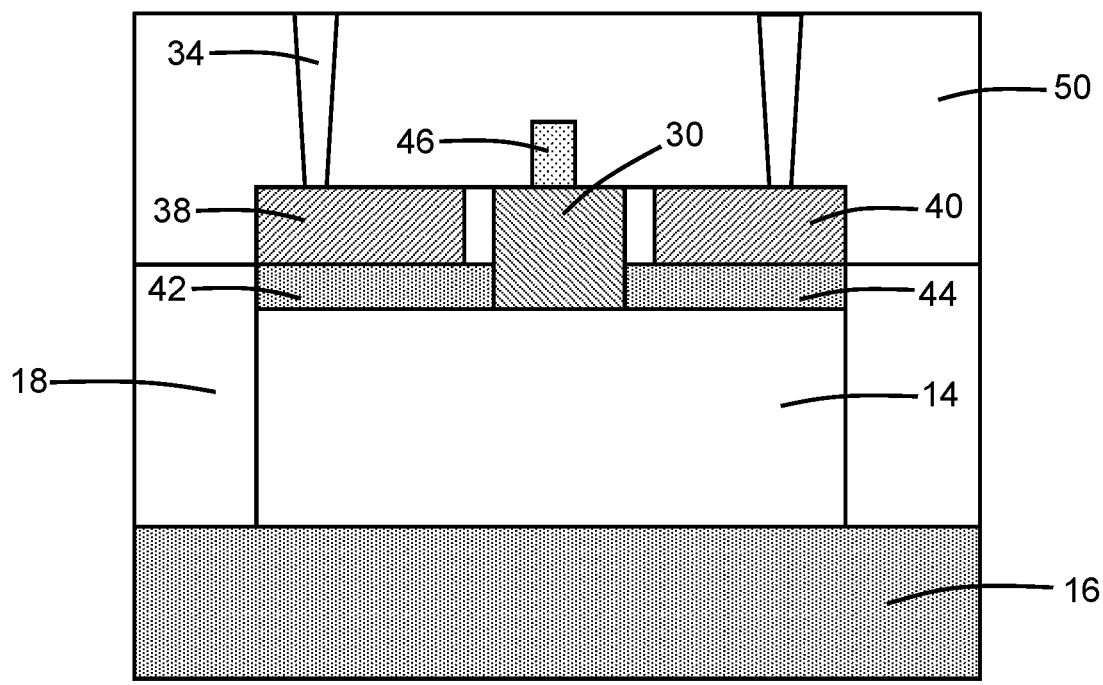
FIG. 10 is a cross-sectional view taken generally along line 10-10 in FIG. 9.

With reference to FIGS. 9, 10 and in accordance with alternative embodiments, a semiconductor layer 46 may be formed over the base layer 30. The semiconductor layer 46 may be deposited and patterned by lithography and etching processes. The semiconductor layer 46, similar to the semiconductor layer 22, may be comprised of a semiconductor material, such as polysilicon. The semiconductor layer 46 may be doped to have an opposite conductivity type from the base layer 30. In an embodiment, the semiconductor layer 46 may be doped (e.g., heavily doped) with a concentration of an n-type dopant (e.g., arsenic or phosphorus) to provide n-type conductivity. In an embodiment, the semiconductor layer 46 defines a modulator that may be biased to control the base carriers.

The base layer 30 is positioned in a vertical direction between the semiconductor layer 46 and the substrate 16. In an embodiment, the semiconductor layer 46 may directly contact the base layer 30 to define a p-n junction of a diode. The semiconductor layer 46 may have a lateral extension 28 with which the base layer 30 has a non-overlapping arrangement. The contact 36 may be coupled to a portion of the lateral extension 28 that has an enlarged area. The enlarged-area portion of the lateral extension 28 facilitates contacting the semiconductor layer 46 while permitting the width dimension of the portion of the semiconductor layer 46 in direct contact with the base layer 30 to be minimized.

Figure 11:
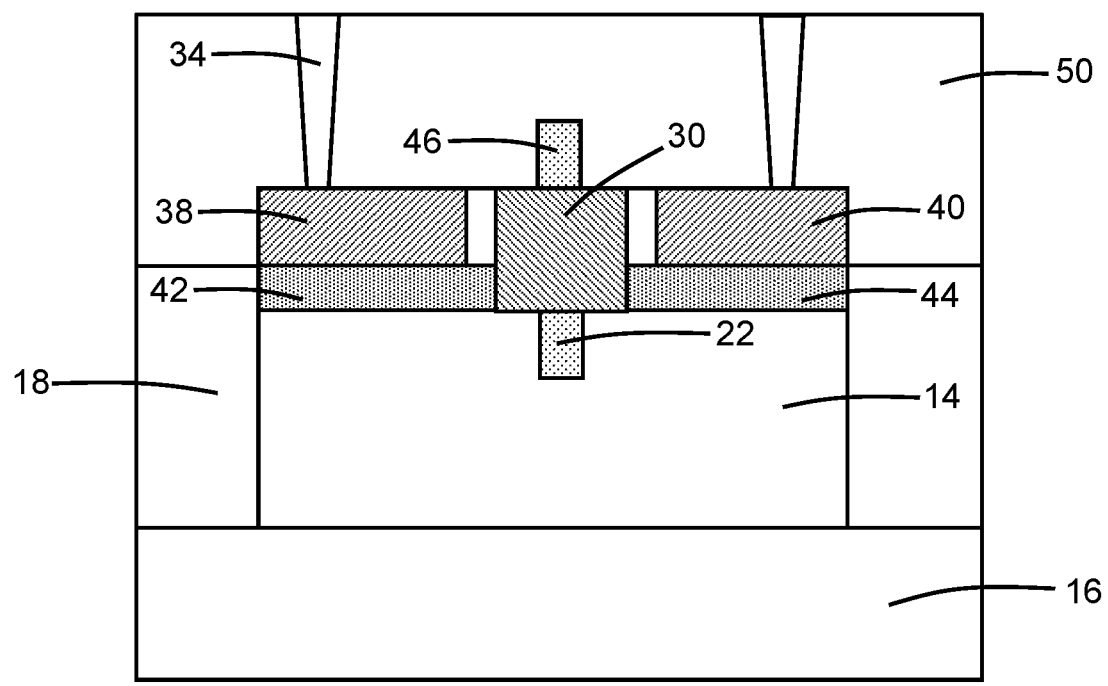
FIG. 11 is a cross-sectional view of a structure in accordance with alternative embodiments of the invention.

With reference to FIG. 11 and in accordance with alternative embodiments, the semiconductor layer 22 may be included in the device structure along with the semiconductor layer 46 such that the semiconductor layer 22 and the semiconductor layer 46 define separate modulators for biasing for controlling the base carriers. The semiconductor layer 46, which may be in direct contact with the base layer 30, may be doped to have the same conductivity type as the semiconductor layer 22, which also may be in direct contact with the base layer 30. The base layer 30 is positioned in a vertical direction between the semiconductor layer 22 and the semiconductor layer 46.

Figure 12:
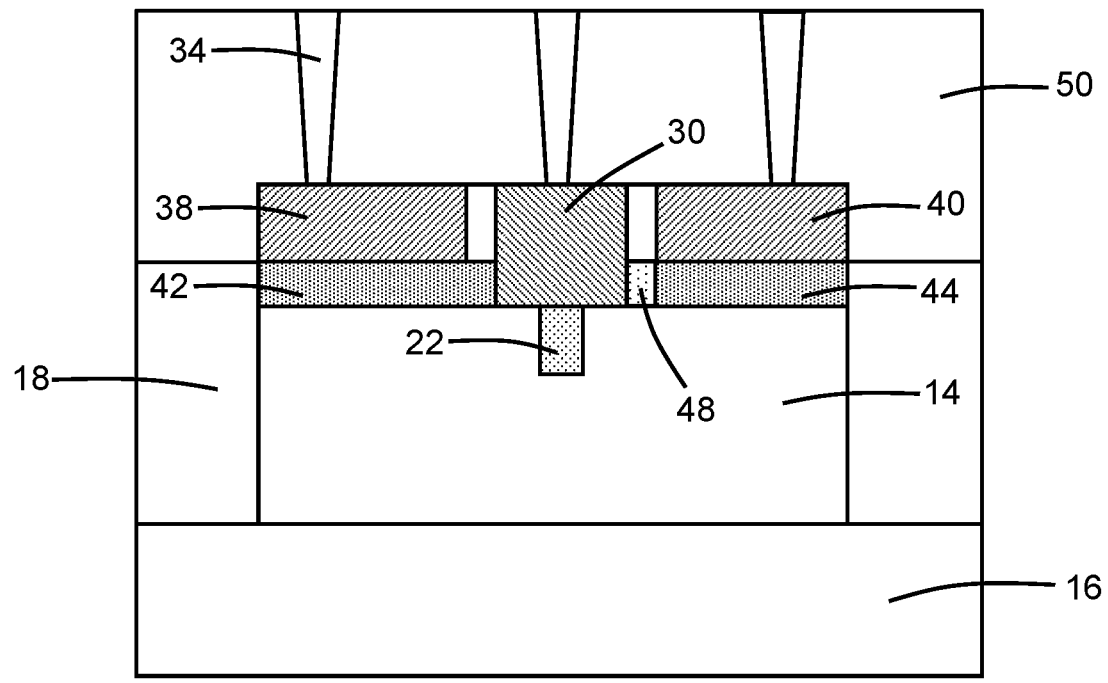
FIG. 12 is a cross-sectional view of a structure in accordance with alternative embodiments of the invention.

With reference to FIG. 12 and in accordance with alternative embodiments, a lightly-doped region 48 may be positioned in the device layer 12 between the doped region 44 and the base layer 30. The lightly-doped region 48, which may have the same conductivity type as the doped region 44 but at a lower dopant concentration than the doped region 44, may provide a graded dopant profile in conjunction with the doped region 44. In an embodiment, the semiconductor material of the lightly-doped region 48 may be doped with a concentration of a dopant, such as an n-type dopant (e.g., phosphorus or arsenic) that provides n-type conductivity. In an embodiment, the lightly-doped region 48 may further include a concentration of carbon in addition to the n-type dopant. In an embodiment in which the doped region 44 is part of the collector, the graded dopant profile resulting from the addition of the lightly-doped region 48 may be effective to reduce the collector/base capacitance.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected"

or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a lateral bipolar junction transistor, the structure comprising:
    a semiconductor-on-insulator substrate including a device layer, a substrate, and a buried insulator layer between the substrate and the device layer, the buried insulator layer having a thickness, and the buried insulator layer including a trench that extends through only a portion of the thickness of the buried insulator layer;
    a first terminal including a first raised semiconductor layer;
    a second terminal including a second raised semiconductor layer;
    a base layer positioned in a lateral direction between the first raised semiconductor layer of the first terminal and the second raised semiconductor layer of the second terminal, the base layer having a first conductivity type; and
    a first modulator including a first semiconductor layer that is positioned within the trench, the first semiconductor layer in direct contact with the base layer, and the first semiconductor layer having a second conductivity type opposite to the first conductivity type.

2. The structure of claim 1 wherein the first semiconductor layer is positioned in a vertical direction between the base layer and the substrate.

3. The structure of claim 1 wherein the buried insulator layer includes a portion that is positioned between the first semiconductor layer and the substrate.

4. The structure of claim 1 wherein the device layer comprises a semiconductor material, the first raised semiconductor layer is positioned on a first section of the device layer, and the second raised semiconductor layer is positioned on a second section of the device layer.

5. The structure of claim 4 wherein the device layer includes a lightly-doped region between the first section of the device layer and the base layer, and the lightly-doped region has the second conductivity type at a lower dopant concentration than the first raised semiconductor layer.

6. The structure of claim 1 wherein the first semiconductor layer is positioned at or below an interface between the device layer and the buried insulator layer.

7. The structure of claim 4 wherein the first raised semiconductor layer and the second raised semiconductor layer have the second conductivity type.

8. The structure of claim 1 wherein the first semiconductor layer and the base layer adjoin along a p-n junction.

9. The structure of claim 1 wherein the first semiconductor layer and the trench are positioned in the lateral direction between the first raised semiconductor layer of the first terminal and the second raised semiconductor layer of the second terminal.

10. The structure of claim 1 further comprising:
    a second modulator including a second semiconductor layer in direct contact with the base layer, the second semiconductor layer of the second modulator having the second conductivity type.

11. The structure of claim 10 wherein the base layer is positioned in a vertical direction between the first semiconductor layer of the first modulator and the second semiconductor layer of the second modulator.

12. The structure of claim 10 wherein the first semiconductor layer of the first modulator and the base layer adjoin along a first p-n junction, and the second semiconductor layer of the second modulator and the base layer adjoin along a second p-n junction.

13. The structure of claim 1 further comprising:
    a first metal contact coupled to the first raised semiconductor layer;
    a second metal contact coupled to the second raised semiconductor layer;
    a third metal contact coupled to the base layer; and
    a fourth metal contact coupled to the first semiconductor layer of the first modulator.

14. The structure of claim 13 wherein the first semiconductor layer includes a lateral extension with which the base layer has a non-overlapping arrangement, and the fourth metal contact is coupled to the lateral extension of the first semiconductor layer.

15. The structure of claim 1 wherein the first raised semiconductor layer and the second raised semiconductor layer have the second conductivity type.

16. A method of forming a structure for a lateral bipolar junction transistor, the method comprising:
    forming a trench that extends through only a portion of a thickness of a buried insulator layer of a silicon-on-insulator substrate, wherein the silicon-on-insulator substrate includes a device layer a substrate, and the buried insulator layer is positioned between the substrate and the device layer;
    forming a first terminal including a first raised semiconductor layer and a second terminal including a second raised semiconductor layer;
    forming a base layer positioned in a lateral direction between the first raised semiconductor layer of the first terminal and the second raised semiconductor layer of the second terminal, wherein the base layer has a first conductivity type; and
    forming a modulator including a semiconductor layer that is positioned inside the trench, wherein the semiconductor layer is in direct contact with the base layer, and the semiconductor layer has a second conductivity type opposite to the first conductivity type.

17. The method of claim 16 wherein the semiconductor layer is positioned in a vertical direction between the base layer and the substrate.

18. The structure of claim 6 wherein the buried insulator layer comprises a dielectric material, and the dielectric material of the buried insulator layer surrounds the first semiconductor layer below the interface.

19. The structure of claim 1 wherein the device layer includes a doped region beneath the first raised semiconductor layer, and the doped region is a portion of the first terminal.

20. The structure of claim 19 wherein the device layer includes a lightly-doped region between the doped region and the base layer, and the lightly-doped region has the second conductivity type at a lower dopant concentration than the first raised semiconductor layer.

* * * * *